(12) United States Patent
Kim (10) Patent No.: US 12,497,328 B2
(45) Date of Patent: Dec. 16, 2025

(54) SUBSTRATE LOADING CASSETTE AND METHOD OF PROCESSING SUBSTRATE USING THE SAME

(71) Applicant: SAMSUNG DISPLAY CO., LTD., Yongin-si (KR)

(72) Inventor: Hyo-Seop Kim, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/637,806

(22) Filed: Apr. 17, 2024

(65) Prior Publication Data

US 2024/0262741 A1 Aug. 8, 2024

Related U.S. Application Data

(62) Division of application No. 17/466,061, filed on Sep. 3, 2021, now Pat. No. 11,993,537.

(30) Foreign Application Priority Data

Jan. 22, 2021 (KR) ........................ 10-2021-0009626

(51) Int. Cl.
*H01L 21/673* (2006.01)
*C03C 21/00* (2006.01)

(52) U.S. Cl.
CPC .................................. *C03C 21/002* (2013.01)

(58) Field of Classification Search
None
See application file for complete search history.

(56) References Cited

U.S. PATENT DOCUMENTS

| | | |
|---|---|---|
| 2,075,446 A | 3/1937 | Leibig |
| 3,147,860 A | 9/1964 | Kean, Sr. et al. |
| 3,410,673 A | 11/1968 | Marusak |
| 3,451,797 A | 6/1969 | Meth |
| 3,503,860 A | 3/1970 | Inoue |
| 3,628,934 A | 12/1971 | Duthoit |
| 3,630,704 A | 12/1971 | Garfinkel et al. |
| 3,650,719 A | 3/1972 | Van Laethem |
| RE27,921 E | 2/1974 | Duthoit |
| 4,036,623 A | 7/1977 | Deeg et al. |
| 4,290,793 A | 9/1981 | Brockway |
| 4,969,560 A | 11/1990 | Stanfield |

(Continued)

FOREIGN PATENT DOCUMENTS

| | | |
|---|---|---|
| KR | 10-1999-0080028 A | 11/1999 |
| KR | 10-0369950 | 1/2003 |

(Continued)

*Primary Examiner* — Jodi C Franklin
(74) *Attorney, Agent, or Firm* — F. CHAU & ASSOCIATES, LLC (57) ABSTRACT

The present disclosure describes a substrate loading cassette. The substrate loading cassette includes a first frame, a second frame, a first supporter coupled with the first frame, and a second supporter movably coupled with the first frame and disposed under the first supporter. The first supporter includes a first support bar and a plurality of first branch portions, and the second supporter includes a second support bar and a plurality of second branch portions. The second branch portions move in a second direction to adjust the spacing between the first and second supporters.

7 Claims, 9 Drawing Sheets

(56) References Cited

U.S. PATENT DOCUMENTS

| | | | |
|---|---|---|---|
| 5,685,684 A | 11/1997 | Kato et al. | |
| 6,092,981 A | 7/2000 | Pfeiffer et al. | |
| 6,099,686 A | 8/2000 | Sugiuti | |
| 6,273,275 B1* | 8/2001 | Kim | H01L 21/6734 211/41.18 |
| 6,312,841 B1 | 11/2001 | Watanabe et al. | |
| 6,534,120 B1* | 3/2003 | Ozawa | G11B 5/8404 427/127 |
| 6,588,605 B1 | 7/2003 | Volkert et al. | |
| 7,931,145 B2* | 4/2011 | Gao | H05K 13/0061 211/41.18 |
| 8,240,490 B2* | 8/2012 | Malekmadani | A47B 96/024 211/188 |
| 9,056,713 B2* | 6/2015 | Li | B65D 85/48 |
| 9,144,901 B2* | 9/2015 | Yang | H01L 21/673 |
| 9,368,381 B2 | 6/2016 | Goto | |
| 9,908,676 B2 | 3/2018 | Sheehan et al. | |
| 9,914,200 B2 | 3/2018 | Wetherill | |
| 10,669,195 B2 | 6/2020 | Abbott, Jr. et al. | |
| 10,669,643 B2 | 6/2020 | Uemura et al. | |
| 11,220,451 B2 | 1/2022 | Kunitomo et al. | |
| 11,370,702 B2 | 6/2022 | Fecher et al. | |
| 11,797,769 B1 | 10/2023 | Gangadharaiah et al. | |
| 2003/0090005 A1 | 5/2003 | Hashimoto | |
| 2004/0200788 A1* | 10/2004 | Shon | H01L 21/6734 211/41.18 |
| 2005/0027387 A1 | 2/2005 | Fujishima | |
| 2005/0089626 A1 | 4/2005 | Wang et al. | |
| 2005/0284179 A1 | 12/2005 | Isono et al. | |
| 2006/0032826 A1* | 2/2006 | Liu | H01L 21/6734 211/41.18 |
| 2006/0043032 A1 | 3/2006 | McHugh | |
| 2006/0226093 A1* | 10/2006 | Cho | H01L 21/6734 211/41.14 |
| 2006/0226094 A1* | 10/2006 | Cho | B65G 49/062 211/41.18 |
| 2007/0003796 A1 | 1/2007 | Isono et al. | |
| 2007/0020067 A1* | 1/2007 | Lin | B65G 49/064 414/811 |
| 2007/0045204 A1 | 3/2007 | Huard et al. | |
| 2007/0090065 A1* | 4/2007 | Lin | H01L 21/6734 211/41.14 |
| 2008/0159832 A1 | 7/2008 | Mitsuyoshi | |
| 2010/0062284 A1 | 3/2010 | Watanabe et al. | |
| 2010/0240200 A1 | 9/2010 | Sakaue et al. | |
| 2010/0249993 A1 | 9/2010 | Mitsuyoshi | |
| 2010/0303600 A1* | 12/2010 | Franz | B65G 49/068 414/792.7 |
| 2011/0054662 A1* | 3/2011 | Hoshino | B65G 59/026 700/157 |
| 2011/0293942 A1* | 12/2011 | Cornejo | C03C 3/083 65/355 |
| 2012/0187406 A1* | 7/2012 | Tsai | H10D 86/411 257/E21.616 |
| 2012/0308722 A1* | 12/2012 | Suzuki | C03C 21/008 427/374.4 |
| 2013/0189068 A1* | 7/2013 | Lee | B65G 49/068 414/800 |
| 2013/0219965 A1 | 8/2013 | Allan et al. | |
| 2014/0042111 A1* | 2/2014 | Yang | H01L 21/67751 211/41.14 |
| 2014/0081458 A1* | 3/2014 | Shimono | H01L 21/6838 700/259 |
| 2014/0326686 A1* | 11/2014 | Li | B65D 85/48 211/41.1 |
| 2014/0366579 A1 | 12/2014 | Antoine et al. | |
| 2015/0013389 A1 | 1/2015 | Oh et al. | |
| 2015/0041435 A1* | 2/2015 | Gu | C03C 21/002 427/299 |
| 2015/0079400 A1 | 3/2015 | Fu et al. | |
| 2015/0166405 A1 | 6/2015 | Murata et al. | |
| 2015/0274420 A1* | 10/2015 | Krommer | B65G 49/067 414/807 |
| 2016/0039588 A1 | 2/2016 | Sheehan | |
| 2016/0083292 A1 | 3/2016 | Tabe et al. | |
| 2016/0145152 A1 | 5/2016 | Martin et al. | |
| 2016/0157606 A1 | 6/2016 | Kaelin | |
| 2016/0214888 A1 | 7/2016 | Morgan | |
| 2016/0326051 A1 | 11/2016 | Kim | |
| 2016/0355431 A1 | 12/2016 | Akiba et al. | |
| 2016/0376113 A1 | 12/2016 | Mader | |
| 2017/0029325 A1 | 2/2017 | Martin et al. | |
| 2017/0047236 A1* | 2/2017 | Shin | H01L 21/67766 |
| 2017/0107141 A1 | 4/2017 | Miyasaka et al. | |
| 2017/0137315 A1 | 5/2017 | Kunitomo et al. | |
| 2017/0233287 A1 | 8/2017 | Li et al. | |
| 2017/0305789 A1 | 10/2017 | Fujii et al. | |
| 2017/0320769 A1 | 11/2017 | Guo et al. | |
| 2018/0002216 A1 | 1/2018 | Ellison et al. | |
| 2018/0057399 A1* | 3/2018 | Harada | H01L 29/06 |
| 2018/0072607 A1 | 3/2018 | Fujii et al. | |
| 2018/0148373 A1 | 5/2018 | Harris et al. | |
| 2018/0193884 A1* | 7/2018 | Jang | H01L 21/67173 |
| 2018/0251395 A1 | 9/2018 | Akiba et al. | |
| 2018/0273425 A1 | 9/2018 | Mishiro et al. | |
| 2019/0002332 A1 | 1/2019 | Saito et al. | |
| 2019/0152847 A1 | 5/2019 | Allan et al. | |
| 2019/0263713 A1 | 8/2019 | Murayama et al. | |
| 2019/0382883 A1 | 12/2019 | Ouyang et al. | |
| 2020/0103559 A1 | 4/2020 | Fujii et al. | |
| 2020/0156990 A1 | 5/2020 | Sakade et al. | |
| 2020/0172434 A1 | 6/2020 | Dafin et al. | |
| 2020/0231496 A1 | 7/2020 | Inokuchi | |
| 2020/0270073 A1 | 8/2020 | Wendel et al. | |
| 2020/0358039 A1* | 11/2020 | Kang | B24B 7/245 |
| 2020/0399173 A1* | 12/2020 | Amin | C03C 23/009 |
| 2021/0183961 A1* | 6/2021 | Kim | H10K 59/353 |
| 2021/0230056 A1* | 7/2021 | Chan | C03C 3/089 |
| 2021/0249452 A1* | 8/2021 | Jung | H01L 21/02532 |
| 2021/0323862 A1 | 10/2021 | Kanehara et al. | |
| 2022/0234948 A1 | 7/2022 | Kim | |
| 2022/0267191 A1 | 8/2022 | Lee et al. | |
| 2022/0363592 A1 | 11/2022 | Shon et al. | |
| 2023/0328907 A1 | 10/2023 | Black et al. | |
| 2023/0337542 A1 | 10/2023 | Yamada | |

FOREIGN PATENT DOCUMENTS

| | | |
|---|---|---|
| KR | 10-1141406 | 5/2012 |
| KR | 10-1189524 B1 | 10/2012 |
| KR | 10-1528716 | 6/2015 |
| KR | 10-1849351 | 4/2018 |

\* cited by examiner

SUBSTRATE LOADING CASSETTE AND METHOD OF PROCESSING SUBSTRATE USING THE SAME

CROSS-REFERENCE TO RELATED APPLICATION

This U.S. non-provisional patent application claims priority under 35 U.S.C. § 119 of Korean Patent Application No. 10-2021-0009626, filed on Jan. 22, 2021, and under 35 U.S.C. § 120 of U.S. patent application Ser. No. 17/466,061, filed on Sep. 3, 2021, the contents of which are incorporated by reference herein in their entirety.

BACKGROUND

1. Field of Disclosure

The present disclosure relates to a substrate loading cassette with improved reliability and a method of processing a substrate using the same.

2. Description of the Related Art

Display devices are used to convey information to a user. Display devices may be included in products such as television sets, mobile phones, navigation units, computer monitors, game units, or the like. Display devices may include fragile substrates and may be made of glass which is brittle and easily damaged.

During the manufacturing process, substrates can be subjected to a reinforcing process to improve surface hardness, impact resistance, and workability. The reinforcing process can include both physical reinforcing and chemical reinforcing. A cassette to load the substrates may be used to facilitate the storage and transfer of the substrates during the reinforcing process.

Traditionally, the cassettes are fixed, and the substrate is provided to the cassettes using a robotic arm. However, variables such as the robotic arm and the thickness of the substrate are not taken into account during the manufacturing process. This can lead to inaccuracy and damage to the substrate. Therefore, there is a need in the art to for an improved display device manufacturing process.

SUMMARY

The present disclosure describes a substrate loading cassette with improved reliability. The present disclosure also describes a method of processing a substrate using the substrate loading cassette.

Embodiments of the inventive concept include a substrate loading cassette including a first frame, a second frame facing the first frame and spaced apart from the first frame in a first direction, a first supporter coupled with the first frame, and a second supporter movably coupled with the first frame and disposed under the first supporter.

The first supporter includes a first support bar coupled with the first frame and extending in a second direction crossing the first direction and a plurality of first branch portions protruding from the first support bar toward the second frame, and the second supporter includes a second support bar coupled with the first frame and extending in the second direction and a plurality of second branch portions protruding from the second support bar toward the second frame. The second branch portions move in a direction substantially parallel to the second direction.

The first branch portions do not overlap the second branch portions when viewed in a third direction crossing the first direction and the second direction. The second branch portions are operated in a first state or a second state, a maximum distance in the second direction between one first branch portion among the first branch portions and one second branch portion adjacent to the one first branch portion among the second branch portions has a first distance in the first state when viewed in the third direction crossing the first direction and the second direction, the maximum distance has a second distance in the second state, and the first distance is greater than the second distance.

Each of the first branch portions protrude from the first support bar to a direction that is substantially parallel to a first crossing direction crossing the first direction and the second direction, and each of the second branch portions protrude from the second support bar to a direction that is substantially parallel to a second crossing direction crossing the first crossing direction.

A distance between one first branch portion among the first branch portions and one second branch portion adjacent to the one first branch portion among the second branch portions increases going from the first frame to the second frame. Each of the first branch portions protrude from the first support bar to a direction substantially parallel to the first direction, and each of the second branch portions protrude from the second support bar to a direction substantially parallel to the first direction.

The substrate loading cassette further includes a third supporter coupled with the second frame and a fourth supporter movably coupled with the second frame and disposed under the third supporter. The third supporter includes a third support bar coupled with the second frame and extending in the second direction and a plurality of third branch portions protruding from the third support bar toward the first frame. The fourth supporter includes a fourth support bar coupled with the second frame and extending in the second direction and a plurality of fourth branch portions protruding from the fourth support bar toward the first frame.

The fourth branch portions move in the direction substantially parallel to the second direction. A distance between one third branch portion among the third branch portions and one fourth branch portion adjacent to the one third branch portion among the fourth branch portions is substantially simultaneously controlled to correspond to a distance between one first branch portion among the first branch portions and one second branch portion adjacent to the one first branch portion among the second branch portions.

The first branch portions respectively face the third branch portions in the first direction, and the second branch portions respectively face the fourth branch portions in the first direction. The first frame, the second frame, the first supporter, and the second supporter include a stainless steel.

Embodiments of the inventive concept provide a method of processing a substrate. The method of processing the substrate includes providing a cassette including a first frame, a second frame spaced apart from the first frame in a first direction, a first support bar coupled with the first frame and extending in a second direction crossing the first direction, a first branch portion protruding from the first support bar toward the second frame, a second support bar disposed under the first support bar, and a second branch portion protruding from the second support bar toward the second frame, fixing a substrate to a robot arm, adjusting a distance in a direction substantially parallel to the second direction between the first branch portion and the second branch portion to a first distance when viewed in a third direction crossing the first direction and the second direction, loading the substrate between the first frame and the second frame, adjusting the distance to a second distance smaller than the first distance, and reinforcing the substrate.

A maximum distance of the first distance is greater than a width in the second direction of the robot arm. A maximum distance of the second distance is greater than a thickness of the substrate in the direction substantially parallel to the second direction. A maximum distance of the second distance is smaller than a width in the second direction of the robot arm.

The adjusting of the distance to the first distance includes moving the second branch portion in the direction substantially parallel to the second direction. The adjusting of the distance to the second distance includes moving the second branch portion in the direction substantially parallel to the second direction.

The reinforcing of the substrate includes preheating the cassette and the substrate, chemically reinforcing the cassette and the substrate, and cooling the cassette and the substrate. The first branch portion protrudes from the first support bar to a direction substantially parallel to a first crossing direction crossing the first direction and the second direction, and the second branch portion protrudes from the second support bar to a direction substantially parallel to a second crossing direction crossing the first crossing direction. The first branch portion protrudes from the first support bar to a direction substantially parallel to the first direction, and the second branch portion is substantially parallel to the first branch portion.

According to the above, the substrate fixed to the robot arm is disposed between the first branch portion and the second branch portion of the cassette, and the distance between the first branch portion and the second branch portion is adjusted by taking into account a size of the robot arm. Therefore, the reliability of an automated process using the robot arm is improved, and damage occurring to the substrate when loading the substrate are reduced. After the substrate is loaded into the cassette, the distance between the first branch portion and the second branch portion is adjusted again by taking into account the thickness of the substrate. Then, the substrate is prevented from shaking in the process of reinforcing the substrate. Therefore, the substrate is prevented from being damaged. Accordingly, the reliability of the substrate loading cassette and the method of processing the substrate using the substrate loading cassette is improved.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

The present disclosure relates generally to a substrate loading cassette. More particularly, embodiments of the present disclosure relate to a substrate loading cassette capable of adjusting the branches of the substrate loading cassette to take into account the thickness of the substate. In some embodiments, the present disclosure adjusts the distance between a first branch portion and a second branch portion by taking into account a size of the robot arm and the substate.

Conventional substrate loading cassettes used a fixed substrate which is attached to a robot arm, where the robot arm is located between a first branch portion and a second branch portion of the cassette. The distance between the first branch portion and the second branch portion is not adjusted by taking into account a size of the robot arm. As such, damage to the substrate is possible and reliability is reduced.

An embodiment of the substrate loading cassette of the present disclosure includes a first frame, a second frame, a first supporter coupled with the first frame, and a second supporter movably coupled with the first frame and disposed under the first supporter. The first supporter includes a first support bar and a plurality of first branch portions, and the second supporter includes a second support bar and a plurality of second branch portions. The second branch portions move in a second direction to adjust the spacing between the first and second supporters.

In the present disclosure, it will be understood that when an element or layer is referred to as being "on", "connected to" or "coupled to" another element or layer, the element or layer can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Therefore, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as with a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 1:
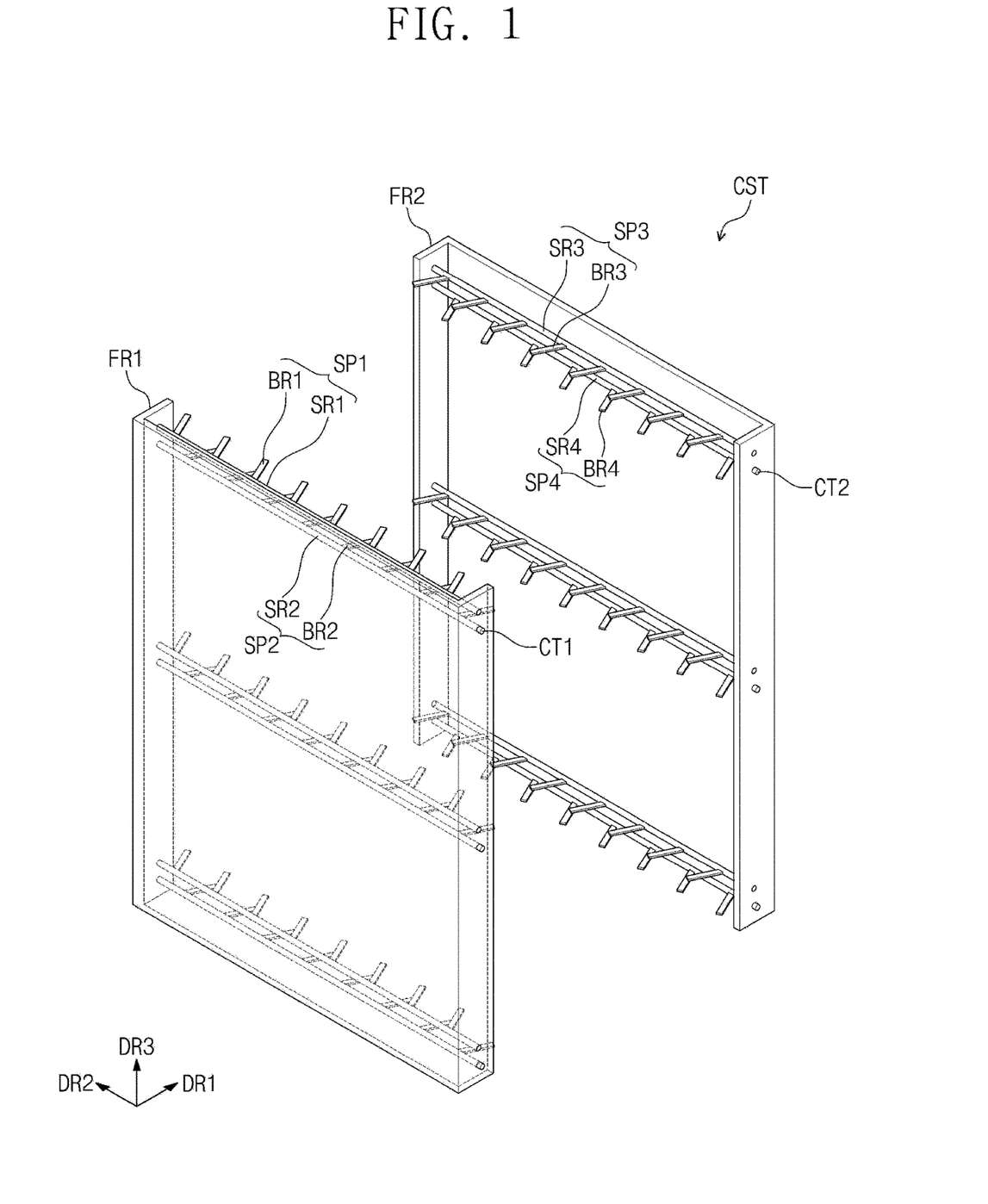
FIG. 1 is a perspective view showing a substrate loading cassette according to an embodiment of the present disclosure.

FIG. 1 is a perspective view showing a substrate loading cassette CST according to an embodiment of the present disclosure.

Referring to FIG. 1, the substrate loading cassette CST may include a first frame FR1, a second frame FR2, a first supporter SP1, a second supporter SP2, a third supporter SP3, and a fourth supporter SP4.

The first frame FR1 and the second frame FR2 may face each other. The second frame FR2 may be spaced apart from the first frame FR1 in a first direction DR1. The first supporter SP1 may be coupled with the first frame FR1. The first supporter SP1 may include a first support bar SR1 and a plurality of first branch portions BR1.

The first support bar SR1 may extend in a second direction DR2 crossing the first direction DR1 (i.e., perpendicular to the first direction DR1). The first branch portions BR1 may protrude from the first support bar SR1 toward the second frame FR2.

The second supporter SP2 may be movably coupled with the first frame FR1. The second supporter SP2 may be disposed under the first supporter SP1. The second supporter SP2 may include a second support bar SR2 and a plurality of second branch portions BR2. The second support bar SR2 may extend in the second direction DR2.

The second branch portions BR2 may protrude from the second support bar SR2 toward the second frame FR2. The second branch portions BR2 may move in a direction substantially parallel to the second direction DR2. A first controller CT1 may control the movement of the second branch portions BR2. For example, the first controller CT1 may control the movement of the second branch portions BR2 using a hydraulic, pneumatic or electric actuator. In some examples, the first controller CT1 moves the second branch portions BR2 by moving the second support bar SR2. However, in other examples, the first controller CT1 moves the second branch portions BR2 directly without moving the second support bar SR2.

Each of the first supporter SP1 and the second supporter SP2 may be provided in plural. The first supporters SP1 and the second supporters SP2 may be alternately arranged one by one in a third direction DR3 crossing (i.e., perpendicular to) the first direction DR1 and the second direction DR2. FIG. 1 shows three first supporters SP1 and three second supporters SP2 as a representative example. However, the number of the first supporters SP1 and the number of the second supporters SP2 should not be limited thereto or thereby. For example, two first supporters SP1 and two second supporters SP2 may be sequentially arranged in the third direction DR3.

The third supporter SP3 may be coupled with the second frame FR2. The third supporter SP3 may include a third support bar SR3 and a plurality of third branch portions BR3. The third support bar SR3 may be coupled with the second frame FR2. The third support bar SR3 may extend in the second direction DR2. The third support bar SR3 may face the first support bar SR1 in the first direction DR1.

The third branch portions BR3 may protrude from the third support bar SR3 toward the first frame FR1. The third branch portions BR3 may respectively face the first branch portions BR1 in the first direction DR1.

The fourth supporter SP4 may be movably coupled with the second frame FR2 and may be disposed under the third supporter SP3. The fourth support bar SR4 may extend in the second direction DR2. The fourth support bar SR4 may face the second support bar SR2 in the first direction DR1. The fourth supporter SP4 may include a fourth support bar SR4 and a plurality of fourth branch portions BR4.

The fourth branch portions BR4 may protrude from the fourth support bar SR4 toward the first frame FR1 and may move in the direction substantially parallel to the second direction DR2. A second controller CT2 may control the movement of the fourth branch portions BR4. For example, the second controller CT2 may control the movement of the fourth branch portions BR4 using a hydraulic, pneumatic or electric actuator. In some examples, the second controller CT2 moves the fourth branch portions BR4 by moving the fourth support bar SR4. However, in other examples, the second controller CT2 moves the fourth branch portions BR4 directly without moving the fourth support bar SR4. The fourth branch portions BR4 may respectively face the second branch portions BR2 in the first direction DR1.

Each of the third supporter SP3 and the fourth supporter SP4 may be provided in plural. The third supporters SP3 and the fourth supporters SP4 may be alternately arranged one by one in the third direction DR3. FIG. 1 shows three third supporters SP3 and three fourth supporters SP4 as a representative example. However, the number of the third supporters SP3 and the number of the fourth supporters SP4 should not be limited thereto or thereby.

The first frame FR1, the second frame FR2, the first supporter SP1, the second supporter SP2, the third supporter SP3, and the fourth supporter SP4 may include a material with heat resistance and chemical resistance. The first frame FR1, the second frame FR2, the first supporter SP1, the second supporter SP2, the third supporter SP3, and the fourth supporter SP4 may include stainless steel. For example, the first frame FR1, the second frame FR2, the first supporter SP1, the second supporter SP2, the third supporter SP3, and the fourth supporter SP4 may include SUS 304 or SUS 316.

According to an embodiment, the first frame FR1, the second frame FR2, the first supporter SP1, the second supporter SP2, the third supporter SP3, and the fourth supporter SP4 may reduce corrosion and chemical reactions that may occur in the cassette CST in a substrate processing process. Additionally or alternatively, a deformation of the cassette CST, which may be caused by thermal expansion and thermal contraction generated after the repeating of the substrate processing process, may be reduced. Accordingly, the reliability of the cassette CST and the substrate processing method may be improved.

Figure 2:
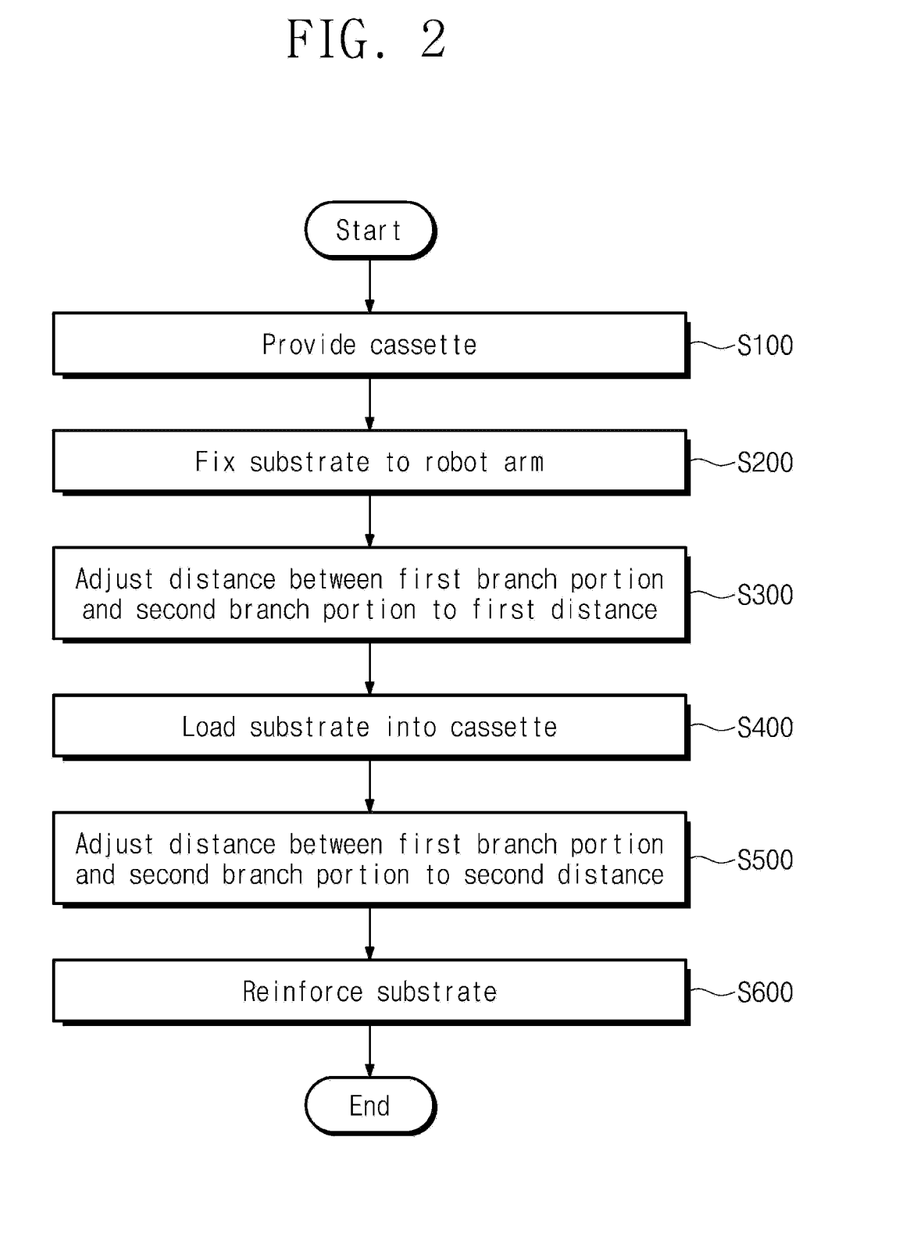
FIG. 2 is a flowchart showing a method of processing a substrate according to an embodiment of the present disclosure.
Figure 3A:
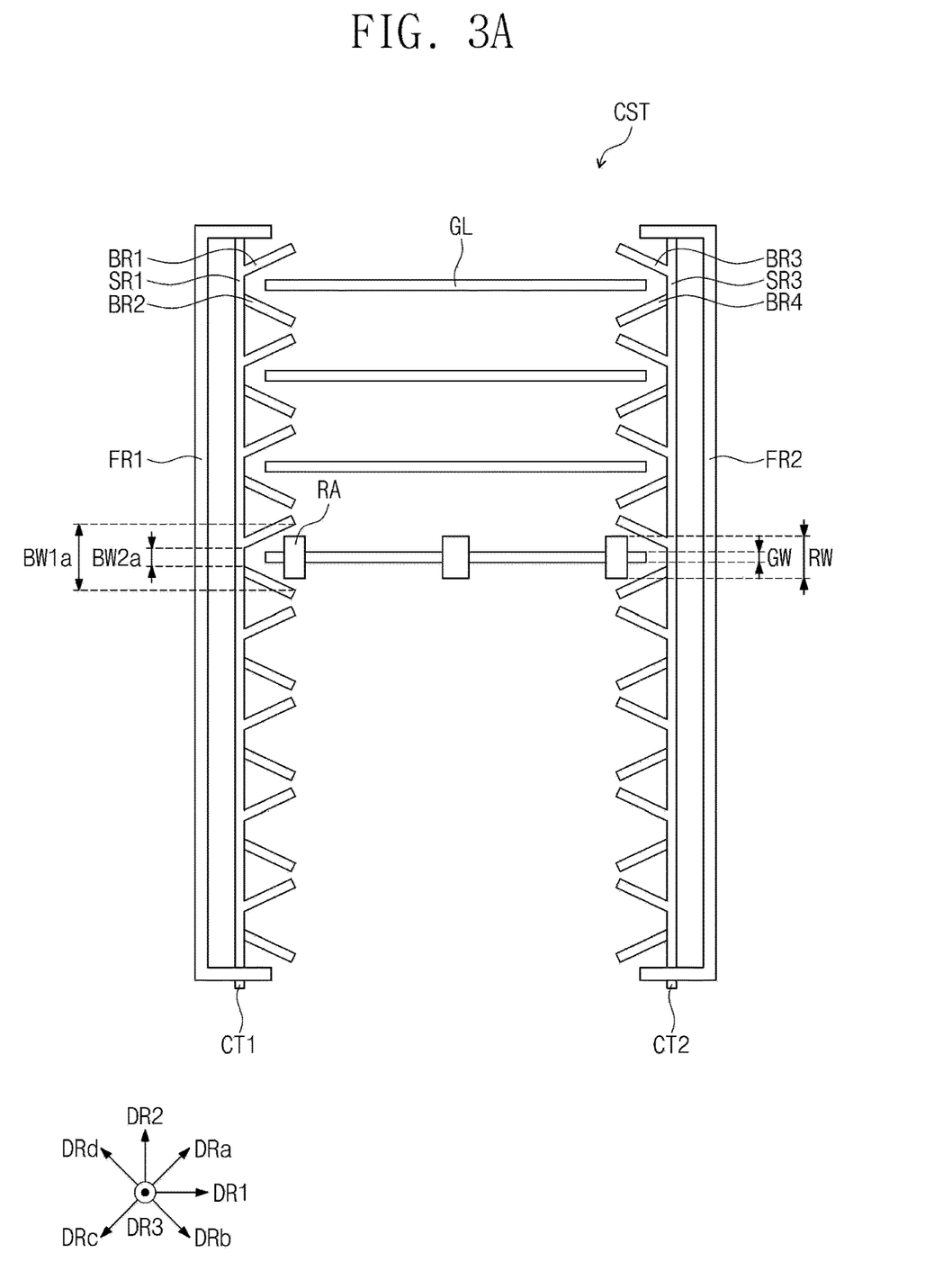
FIG. 3A is a plan view showing a substrate loading cassette according to an embodiment of the present disclosure.

FIG. 2 is a flowchart showing a method of processing a substrate according to an embodiment of the present disclosure. FIG. 3A is a plan view showing the substrate loading cassette CST according to an embodiment of the present disclosure.

Referring to FIGS. 1 to 3A, the cassette CST into which the substrate GL is loaded may be provided (S100) to prevent the substrate GL from being influenced by impacts, contaminations, scratches, dust, etc., in the process of processing the substrate GL.

The cassette CST may include the first frame FR1, the second frame FR2, the first support bar SR1, the first branch portions BR1, the second support bar SR2, the second branch portions BR2, the third support bar SR3, the third branch portions BR3, the fourth support bar SR4, and the fourth branch portions BR4.

When viewed in the third direction DR3, each of the first branch portions BR1 may protrude from the first support bar SR1 to a direction that may be substantially parallel to a first crossing direction DRa crossing the first direction DR1 and the second direction DR2. Each of the second branch portions BR2 may protrude from the second support bar SR2 to a direction that is substantially parallel to a second crossing direction DRb crossing the first crossing direction DRa.

When viewed in the third direction DR3, the first support bar SR1 may overlap the second support bar SR2, and the first branch portions BR1 may not overlap the second branch portions BR2.

When viewed in the third direction DR3, a distance between one first branch portion among the first branch portions BR1 and one second branch portion among the second branch portions BR2 adjacent to the one first branch portion may increase going from the first frame FR1 to the second frame FR2.

When viewed in the third direction DR3, each of the third branch portions BR3 may protrude from the third support bar SR3 to a direction that is substantially parallel to a third crossing direction DRc opposite to the first crossing direction DRa. Each of the fourth branch portions BR4 may protrude from the fourth support bar SR4 to a direction that is substantially parallel to a fourth crossing direction DRd crossing the third crossing direction DRc and opposite to the second crossing direction DRb.

When viewed in the third direction DR3, the third support bar SR3 may overlap the fourth support bar SR4, and the third branch portions BR3 may not overlap the fourth branch portions BR4.

When viewed in the third direction DR3, a distance between one third branch portion among the third branch portions BR3 and one fourth branch portion among the fourth branch portions BR4 adjacent to the one third branch portion may increase going from the second frame FR2 to the first frame FR1.

The substrate GL may be loaded into the cassette CST regardless of the size of the substrate GL by adjusting a distance in the first direction DR1 between the first frame FR1 and the second frame FR2. Accordingly, the cost of changing the cassette CST in accordance with the size of the substrate GL may be reduced, and the yield of the process of processing the substrate GL may be improved.

The substrate GL may be a glass substrate. The substrate GL may be a thin glass substrate. For example, the substrate GL may have a thickness GW equal to or smaller than about 70 micrometers (μm) in the second direction DR2. The substrate GL may be reinforced by a chemical processing process, and the reinforced substrate may be used as a window of the display device.

In the process of processing the substrate GL, a robot arm RA may be used and the substrate GL may be fixed to the robot arm RA (S200). Different from the present disclosure, in a case where the substrate GL is loaded into the cassette CST or processed without using the robot arm RA, the substrate GL may be damaged or broken due to the thickness GW of the substrate GL in the process of processing the substrate GL. However, the robot arm RA is used to fix the substrate GL at constant force to prevent the substrate GL from being damaged. Therefore, the substrate GL may be easily processed. Accordingly, the reliability of the substrate processing method may be improved.

The robot arm RA may automate the process of processing the substrate GL. The robot arm RA may reduce the number of people and time used in the process of processing the substrate GL and may improve the yield.

The robot arm RA may be provided in plural. The robot arms RA may be arranged in the first direction DR1 to fix the substrate GL. FIG. 3A shows three robot arms RA as a representative example. However, the number of the robot arms RA should not be particularly limited as long as the robot arms RA may fix the substrate GL. For example, two robot arms RA may be used, and the robot arms RA may be disposed respectively adjacent to the first frame FR1 and the second frame FR2 to fix the substrate GL.

The first controller CT1 may move one second branch portion BR2 (hereinafter, referred to as a second branch portion BR2) among the second branch portions BR2 in the direction that is substantially parallel to the second direction DR2. The first controller CT1 may control a distance in the direction that is substantially parallel to the second direction DR2 between one first branch portion BR1 (hereinafter, referred to as a first branch portion BR1), which may be adjacent to the second branch portion BR2, among the first branch portions BR1 and the second branch portion BR2. When viewed in the third direction DR3, a maximum distance in the direction that is substantially parallel to the second direction DR2 between the first branch portion BR1 and the second branch portion BR2 may be adjusted to a first distance BW1a (S300), e.g., using an actuator. The cassette CST in which the distance is adjusted to the first distance BW1a may be referred to as operating in a first state.

In some examples, size information for the substrate GL is provided to a controller which determines the distance between branch portions (or the operating state of the cassette CST). For example, if the width of the substrate is greater than a threshold width, the distance between the first branch portion BR1 and the second branch portion BR2 can be increased. Additionally or alternatively, if the width of the substrate is below a threshold, the distance between the first branch portion BR1 and the second branch portion BR2 can be decreased. In another example, the distance can be calculated based on a linear relationship between the distance and the width of the substrate. However, the present disclosure is not limited to these examples for determining the distance between the first branch portion BR1 and the second branch portion BR2. Thus, in some examples the distance between the first branch portion BR1 and the second branch portion BR2 can be adjusted based on the width of the substrate.

Additionally or alternatively, the distance between the first branch portion BR1 and the second branch portion BR2 can be adjusted based on the size of the robot arm that moves the substrate GL into the cassette CST. For example, information regarding the size of the robot arm can be provided to a controller, which computes the distance to enable safe operation of the robot arm to load the substrate GL into the cassette CST.

The first distance BW1a may be greater than a width RW in the direction that is substantially parallel to the second direction DR2 of the robot arm RA. Accordingly, when the substrate GL is loaded, the robot arm RA may be prevented from colliding or interfering with the first branch portion BR1 and the second branch portion BR2.

When the robot arm RA loads the substrate GL, the robot arm RA may be spaced apart from the first branch portion BR1 and the second branch portion BR2. When viewed in the third direction DR3, the robot arm RA may easily insert the substrate GL between the first branch portion BR1 and the second branch portion BR2. Accordingly, the reliability of the substrate processing method may be improved.

When viewed in the third direction DR3, a minimum distance in the direction that may be substantially parallel to the second direction DR2 between the first branch portion BR1 and the second branch portion BR2 may be a first minimum distance BW2a. The first minimum distance BW2a may be greater than the thickness GW of the substrate GL.

When the robot arm RA loads the substrate GL, the substrate GL may be spaced apart from the first branch portion BR1 and the second branch portion BR2. When viewed in the third direction DR3, the substrate GL may be easily inserted into between the first branch portion BR1 and the second branch portion BR2.

When viewed in the third direction DR3, the second controller CT2 may move one fourth branch portion BR4 (hereinafter, referred to as a fourth branch portion BR4) among the fourth branch portions BR4 in the direction that may be substantially parallel to the second direction DR2. The second controller CT2 may control a distance in the direction that is substantially parallel to the second direction DR2 between one third branch portion BR3 (hereinafter, referred to as a third branch portion BR3), which may be adjacent to the fourth branch portion BR4, among the third branch portions BR3 and the fourth branch portion BR4. The distance in the direction that is substantially parallel to the second direction DR2 between the third branch portion BR3 and the fourth branch portion BR4 may be substantially simultaneously controlled to correspond to the distance in the direction that is substantially parallel to the second direction DR2 between the first branch portion BR1 and the second branch portion BR2.

The substrate GL fixed to the robot arm RA may be loaded into the cassette CST (S400). The substrate GL may be provided in plural and may be loaded into the cassette CST. The substrates GL may be spaced apart from each other in the direction that is substantially parallel to the second direction DR2 while being loaded into the cassette CST.

Figure 3B:
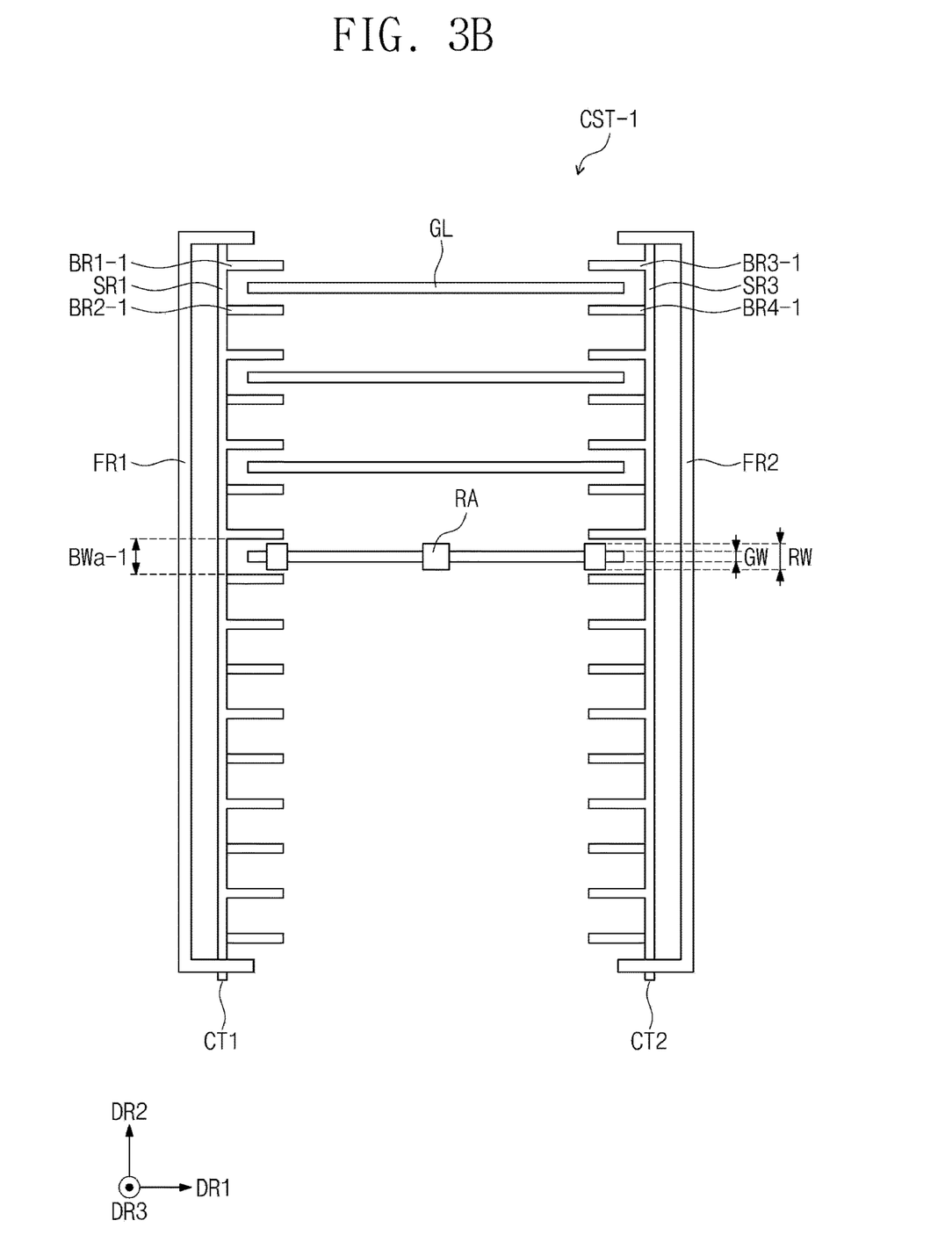
FIG. 3B is a plan view showing a substrate loading cassette according to an embodiment of the present disclosure.

FIG. 3B is a plan view showing a substrate loading cassette CST-1 according to an embodiment of the present disclosure. In FIG. 3B, the same reference numerals denote the same elements in FIG. 3A. Therefore, detailed descriptions of the same elements will be omitted.

Referring to FIGS. 2 and 3B, when viewed in the third direction DR3, each of the first branch portions BR1-1 mayprotrude from a first support bar SR1 to a direction that is substantially parallel to the first direction DR1. Each of the second branch portions BR2-1 may protrude from a second support bar SR2 (refer to FIG. 1) to the direction that is substantially parallel to the first direction DR1. The first branch portions BR1-1 may be substantially parallel to the second branch portions BR2-1. When viewed in the third direction DR3, the first branch portions BR1-1 may not overlap the second branch portions BR2-1.

When viewed in the third direction DR3, each of the third branch portions BR3-1 may protrude from a third support bar SR3 to the direction that is substantially parallel to the first direction DR1. Each of the fourth branch portions BR4 may protrude from a fourth support bar SR4 (refer to FIG. 1) to the direction that is substantially parallel to the first direction DR1. The third branch portions BR3-1 may be substantially parallel to the fourth branch portions BR4-1.

When viewed in the third direction DR3, the third branch portions BR3-1 may not overlap the fourth branch portions BR4-1.

A first controller CT1 may move one second branch portion BR2-1 (hereinafter, referred to as a second branch portion BR2-1) among the second branch portions BR2-1 in a direction that is substantially parallel to the second direction DR2. The first controller CT1 may control a distance in the direction that is substantially parallel to the second direction DR2 between one first branch portion BR1-1 (hereinafter, referred to as a first branch portion BR1-1), which may be adjacent to the second branch portion BR2-1, among the first branch portions BR1-1 and the second branch portion BR2-1. When viewed in the third direction DR3, the distance in the direction that is substantially parallel to the second direction DR2 between the first branch portion BR1-1 and the second branch portion BR2-1 may be adjusted to a first distance BWa-1 (S300). The first distance BWa-1 may be greater than the width RW in the direction that may be substantially parallel to the second direction DR2 of the robot arm RA.

When the robot arm RA loads the substrate GL, the robot arm RA may be spaced apart from the first branch portion BR1-1 and the second branch portion BR2-1. When viewed in the third direction DR3, the robot arm RA may easily insert the substrate GL into between the first branch portion BR1-1 and the second branch portion BR2-1. Accordingly, the reliability of the substrate processing method may be improved.

When viewed in the third direction DR3, a second controller CT2 may move one fourth branch portion BR4-1 (hereinafter, referred to as a fourth branch portion BR4-1) among the fourth branch portions BR4-1 in the direction that is substantially parallel to the second direction DR2. The second controller CT2 may control a distance in the direction that is substantially parallel to the second direction DR2 between one third branch portion BR3-1 (hereinafter, referred to as a third branch portion BR3-1), which may be adjacent to the fourth branch portion BR4-1 among the third branch portions BR3-1 and the fourth branch portion BR4-1. The distance in the direction that is substantially parallel to the second direction DR2 between the third branch portion BR3-1 and the fourth branch portion BR4-1 may be substantially simultaneously controlled to correspond to the distance in the direction that is substantially parallel to the second direction DR2 between the first branch portion BR1-1 and the second branch portion BR2-1.

Figure 4:
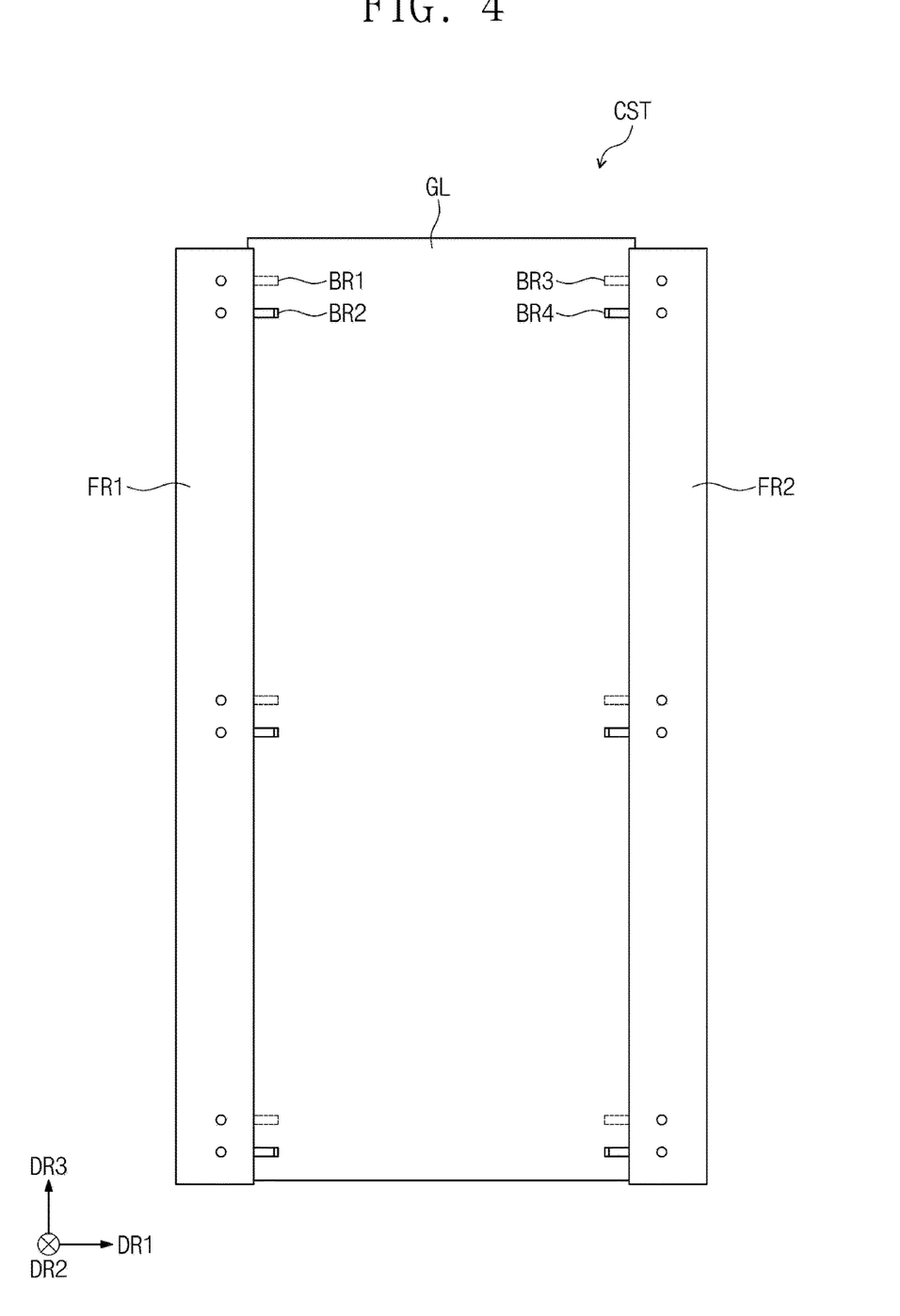
FIG. 4 is a side view showing a substrate loading cassette according to an embodiment of the present disclosure.

FIG. 4 is a side view showing the substrate loading cassette CST according to an embodiment of the present disclosure.

Referring to FIGS. 1 and 4, the substrate GL may be loaded into the cassette CST.

Each of the first supporter SP1, the second supporter SP2, the third supporter SP3, and the fourth supporter SP4 may be provided in plural. The first supporters SP1 and the second supporters SP2 may be sequentially arranged in the direction that is substantially parallel to the third direction DR3. The third supporters SP3 and the fourth supporters SP4 may be sequentially arranged in the direction that is substantially parallel to the third direction DR3.

The second branch portion BR2 may be disposed under the first branch portion BR1, and the fourth branch portion BR4 may be disposed under the third branch portion BR3.

The first branch portion BR1 and the third branch portion BR3 may support a first surface of the substrate GL. The second branch portion BR2 and the fourth branch portion BR4 may support a second surface that is opposite to the first surface of the substrate GL in the second direction DR2.

FIG. 4 shows three first branch portions BR1, three second branch portions BR2, three third branch portions BR3, and three fourth branch portions BR4 as a representative example. However, the number of each of the first supporters SP1, the second supporters SP2, the third supporters SP3, and the fourth supporters SP4 should not be particularly limited as long as they may support the substrate GL. For example, the number of each of the first supporters SP1, the second supporters SP2, the third supporters SP3, and the fourth supporters SP4 may be two, and they may support the substrate GL.

Figure 5A:
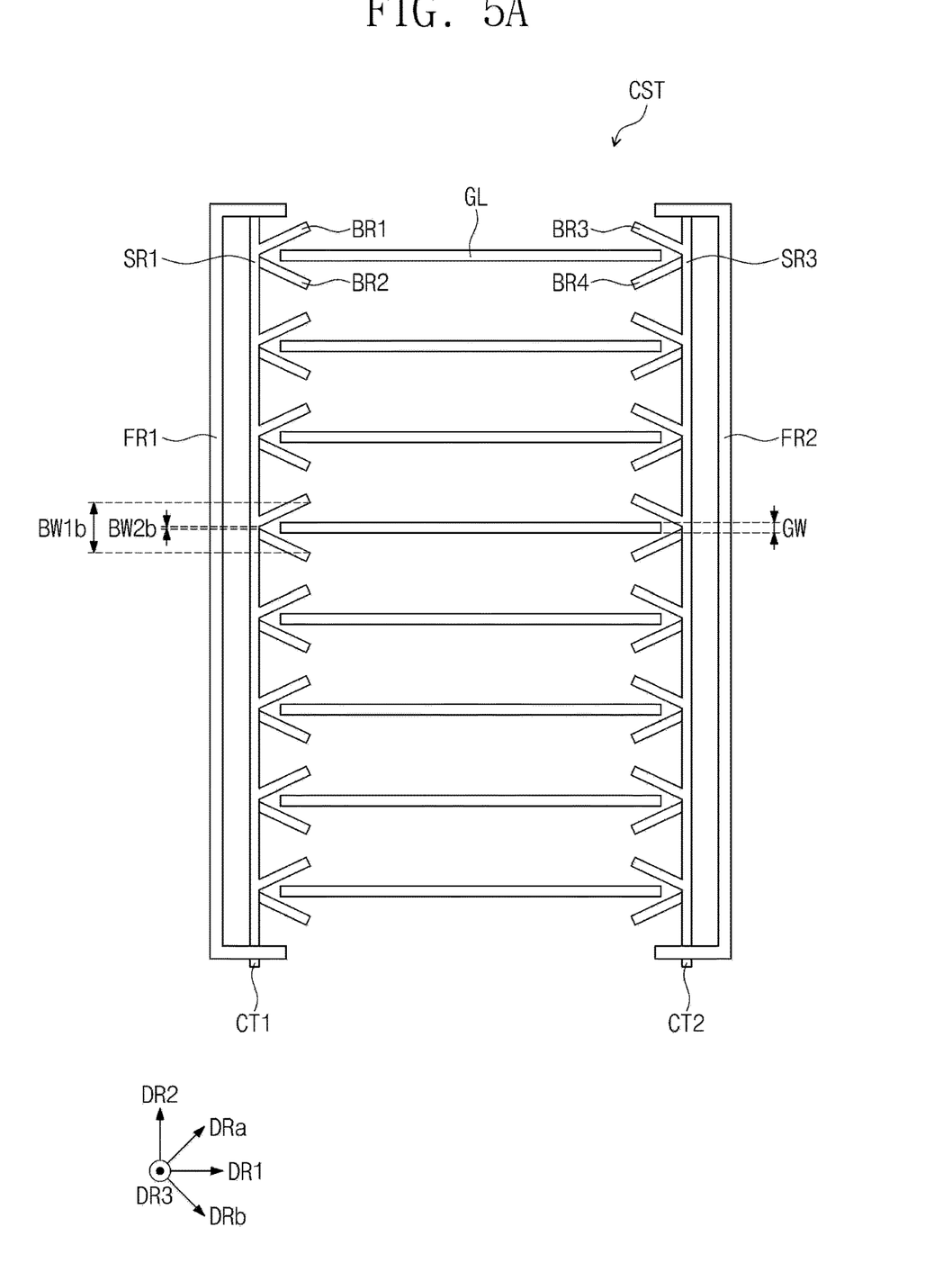
FIG. 5A is a plan view showing a substrate loading cassette according to an embodiment of the present disclosure.

FIG. 5A is a plan view showing a substrate loading cassette CST according to an embodiment of the present disclosure. In FIG. 5A, the same reference numerals denote the same elements in FIG. 3A. Therefore, detailed descriptions of the same elements will be omitted.

Referring to FIGS. 2 and 5A, a substrate GL may be loaded into the cassette CST. When viewed in the third direction DR3, a maximum distance in the direction that is substantially parallel to the second direction DR2 between a first branch portion BR1 and a second branch portion BR2 may be adjusted to a second distance BW1$b$ (S500). The cassette CST in which the distance is adjusted to the second distance BW1$b$ may be referred to as operating in a second state.

The second distance BW1$b$ may be greater than a thickness GW of the substrate GL in the direction that is substantially parallel to the second direction DR2. The second distance BW1$b$ may be smaller than the width RW of the robot arm RA (refer to FIG. 3A) in the direction that is substantially parallel to the second direction DR2.

The first branch portion BR1 and the second branch portion BR2 may be disposed adjacent to the substrate GL. When the reinforcing of the substrate GL is performed (S600), the first branch portion BR1 and the second branch portion BR2 may support the substrate GL. The first branch portion BR1 and the second branch portion BR2 may prevent the substrate GL from shaking. Accordingly, the reinforcing of the substrate GL (S600) may be easily performed. Therefore, the reliability of the substrate loading cassette CST and the substrate processing method may be improved.

When viewed in the third direction DR3, a minimum distance in the direction that is substantially parallel to the second direction DR2 between the first branch portion BR1 and the second branch portion BR2 may be a second minimum distance BW2$b$. The second minimum distance BW2$b$ may be smaller than the thickness GW of the substrate GL.

A distance between the first branch portion BR1 and the second branch portion BR2 may increase going from the first frame FR1 to the second frame FR2. The substrate GL loaded into the cassette CST may be supported by the first branch portion BR1 and the second branch portion BR2. The first branch portion BR1 and the second branch portion BR2 may prevent the substrate GL from shaking. Accordingly, the reinforcing of the substrate GL may be easily performed (S500). Therefore, the reliability of the substrate loading cassette CST and the substrate processing method may be improved.

The first distance BW1$a$ (refer to FIG. 3A) may be greater than the second distance BW1$b$. The distance between the first branch portion BR1 and the second branch portion BR2 may be adjusted to the first distance BW1$a$ (refer to FIG. 3A) (S300) before the loading of the substrate GL (S400). A space to load the substrate GL that is fixed to the robot arm RA (refer to FIG. 3A) may be secured in the cassette CST. The first distance BW1$a$ (refer to FIG. 3A) between the first branch portion BR1 and the second branch portion BR2 may be controlled by taking into account the size of the robot arm. The robot arm RA (refer to FIG. 3A) may be prevented from colliding or interfering with the first branch portion BR1 and the second branch portion BR2 while the robot arm RA (refer to FIG. 3A) loads the substrate GL. Accordingly, the reliability of the automated process of the substrate processing method may be improved. Accordingly, the reliability of the automated process using the robot arm RA (refer to FIG. 3A) may be improved, and the damage on the substrate GL caused when loading the substrate GL may be reduced.

After the substrate GL is loaded into the cassette CST (S400), the distance between the first branch portion BR1 and the second branch portion BR2 may be adjusted to the second distance BW1$b$ (S500). The cassette CST may support the substrate GL using the first branch portion BR1 and the second branch portion BR2, which have the second distance BW1$b$ smaller than the first distance BW1$a$ (refer to FIG. 3A). Accordingly, the substrate GL may be prevented from shaking in the reinforcing of the substrate GL (S600). The damage on the substrate GL may be prevented from occurring. Accordingly, the reliability of the substrate loading cassette CST and the substrate processing method may be improved.

Figure 5B:
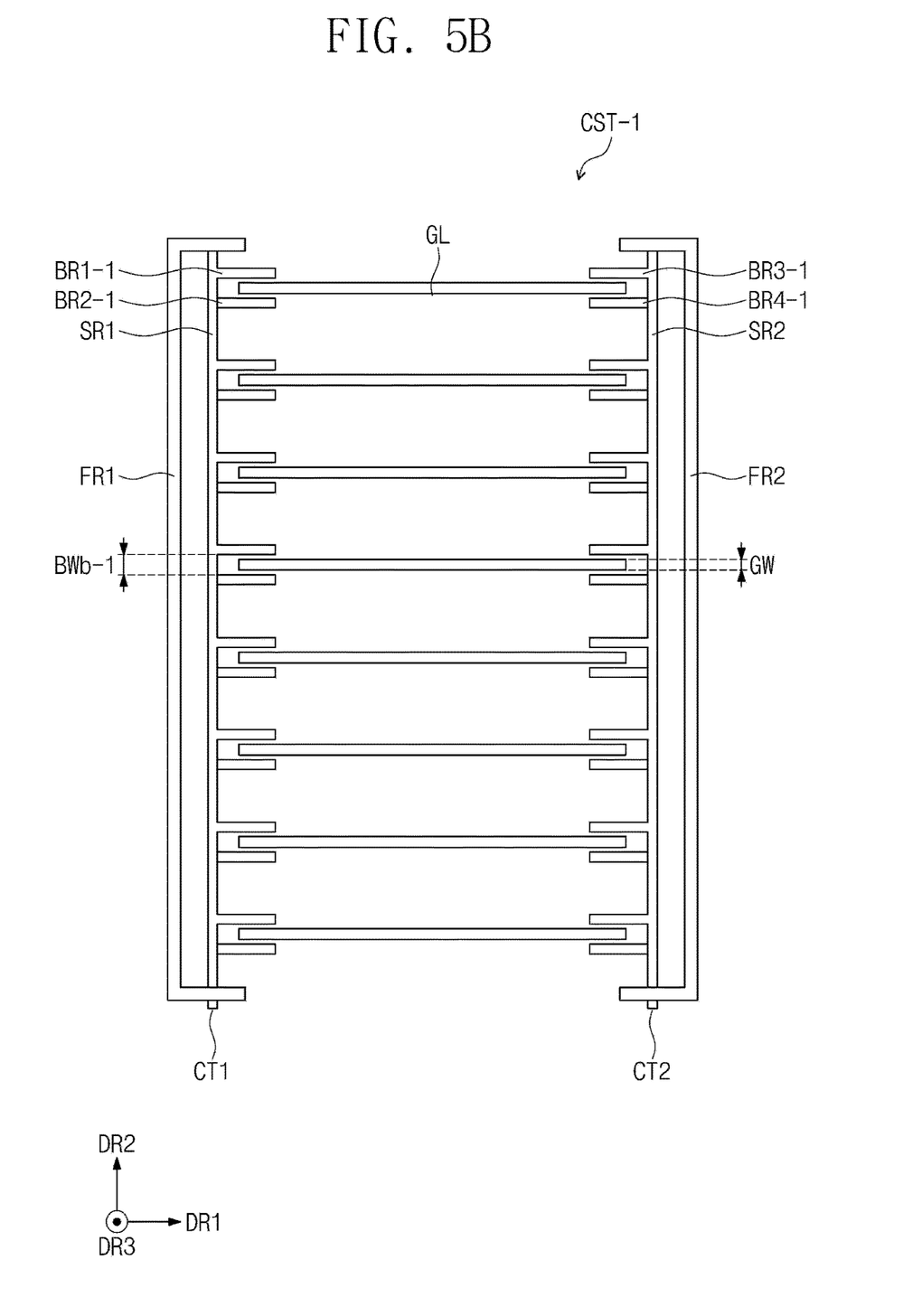
FIG. 5B is a plan view showing a substrate loading cassette according to an embodiment of the present disclosure.

FIG. 5B is a plan view showing a substrate loading cassette CST-1 according to an embodiment of the present disclosure. In FIG. 5B, the same reference numerals denote the same elements in FIGS. 3B and 5A. Therefore, detailed descriptions of the same elements will be omitted.

Referring to FIGS. 2 and 5B, when viewed in the third direction DR3, a distance between a first branch portion BR1-1 and a second branch portion BR2-1 in the direction that is substantially parallel to the second direction DR2 may be adjusted to a second distance BWb-1 (S500).

The second distance BWb-1 may be greater than a thickness GW of a substrate GL in the direction that is substantially parallel to the second direction DR2. The second distance BWb-1 may be smaller than the width RW of the robot arm RA (refer to FIG. 3B) in the direction that is substantially parallel to the second direction DR2.

The first branch portion BR1-1 and the second branch portion BR2-1 may be disposed adjacent to the substrate GL. When the reinforcing of the substrate GL is performed (S600), the first branch portion BR1-1 and the second branch portion BR2-1 may support the substrate GL. The first branch portion BR1-1 and the second branch portion BR2-1 may prevent the substrate GL from shaking. Accordingly, the reinforcing of the substrate GL (S600) may be easily performed. Therefore, the reliability of the substrate loading cassette CST and the substrate processing method may be improved.

The first distance BWa-1 (refer to FIG. 3B) may be greater than the second distance BWb-1. In the cassette CST-1, the distance between the first branch portion BR1-1 and the second branch portion BR2-1 may be adjusted to the first distance BWa-1 (refer to FIG. 3B) (S300) before the loading of the substrate GL (S400). A space to load the substrate GL that is fixed to the robot arm RA (refer to FIG. 3B) may be secured in the cassette CST-1. Accordingly, the reliability of the automated process using the robot arm RA (refer to FIG. 3B) may be improved, and the damage on the substrate GL caused when loading the substrate GL may be reduced.

After the loading of the substrate GL into the cassette CST-1 (S400), the distance between the first branch portion BR1-1 and the second branch portion BR2-1 may be adjusted to the second distance BWb-1 (S500). The cassette CST-1 maysupport the substrate GL using the first branch portion BR1-1 and the second branch portion BR2-1, which have the second distance BWb-1 smaller than the first distance BWa-1 (refer to FIG. 3B). Accordingly, the substrate GL may be prevented from shaking in the reinforcing of the substrate GL (S600). Additionally, or alternatively, the damage on the substrate GL may be prevented. Therefore, the reliability of the substrate loading cassette CST-1 and the substrate processing method may be improved.

Figure 6:
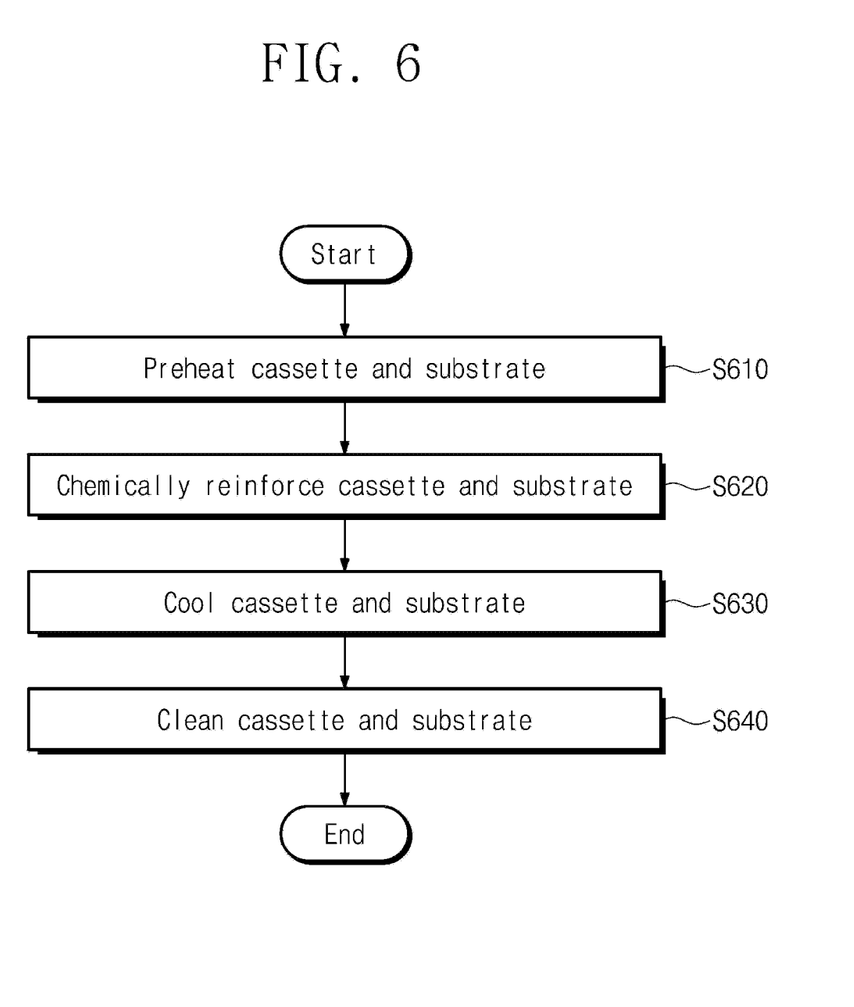
FIG. 6 is a flowchart showing a process of reinforcing a substrate according to an embodiment of the present disclosure.
Figure 7:
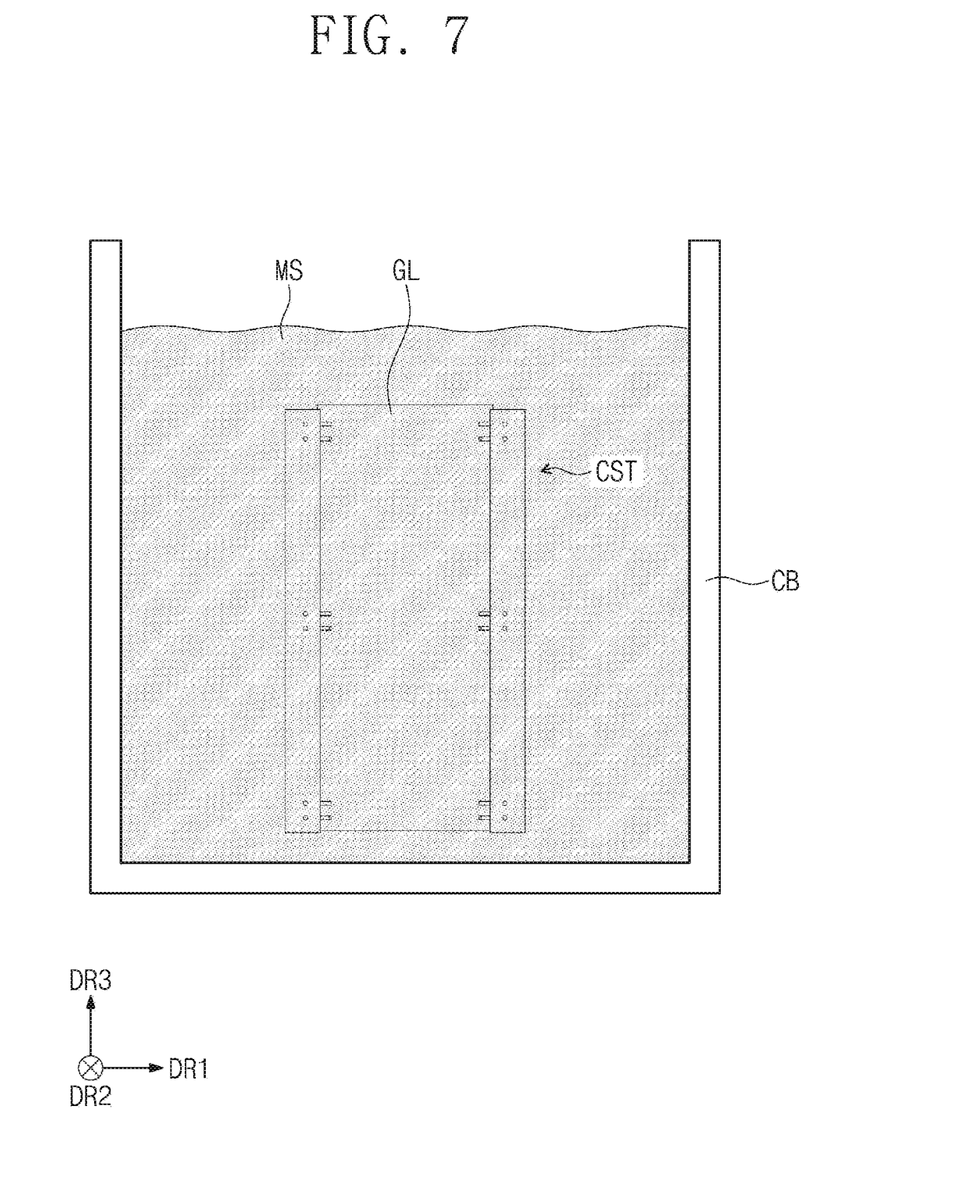
FIG. 7 is a view showing a process of chemically reinforcing a substrate according to an embodiment of the present disclosure.

FIG. 6 is a flowchart showing the process of reinforcing the substrate according to an embodiment of the present disclosure. FIG. 7 is a view showing a process of chemically reinforcing a substrate according to an embodiment of the present disclosure.

Referring to FIGS. 6 and 7, the reinforcing of the substrate (S600) may include preheating the cassette CST and the substrate GL (S610), chemically reinforcing the cassette CST and the substrate GL (S620), cooling the cassette CST and the substrate GL (S630), and cleaning the cassette CST and the substrate GL (S640).

The preheating of the cassette CST and the substrate GL (S610) may be a process of preheating and heating the substrate GL at a certain level of temperature to chemically reinforce the substrate GL. The preheating of the substrate GL (S610) may be performed by repeating the process of increasing temperature and maintaining a constant temperature. Therefore, the substrate GL may be prevented from being damaged due to a thermal expansion caused by a sudden heating of the substrate GL. The preheating (S610) may improve reactivity in the chemical reinforcing of the cassette CST and the substrate GL (S620).

In the chemical reinforcing of the cassette CST and the substrate GL (S620), the cassette CST and the substrate GL may be loaded into the reinforcing furnace CB. The reinforcing furnace CB may accommodate a melting solution MS used for the chemical reinforcing process. The substrate GL may be chemically reinforced by carrying out an ion substitution reaction with the melting solution MS. For example, the melting solution MS may include a potassium nitrate solution.

The reinforcing furnace CB may have chemical and heat resistance. For example, the reinforcing furnace CB may include stainless steel. The reinforcing furnace CB may uniformly maintain a temperature of the melting solution MS and may prevent heat loss.

The substrate GL may be preheated in the preheating (S610). Therefore, the ion substitution reaction may be easily performed between a sodium ion on a surface of the substrate GL and the potassium nitrate solution that is the melting solution MS.

The ion substitution reaction may be performed in the substrate GL provided in the melting solution MS with high temperature. For example, the high temperature may be within a range from about 400° C. to about 500° C. In the chemical reinforcing of the cassette CST and the substrate GL (S620), small particles on the substrate GL may be ion-exchanged with large particles of melting solution MS. For example, the small particles may be sodium ions, and the large particles may be potassium ions. The melting solution MS may include liquefied potassium nitrate (KNO3). The sodium ions (Na+) with a small ionic radius, which are distributed on the surface of the substrate GL, may be substituted with the potassium ions (K+) with a large ionic radius of the potassium nitrate solution. A compressive stress layer may be formed on the surface of the substrate GL by the ion substitution reaction. Therefore, a surface density may be improved.

The cooling of the cassette CST and the substrate GL (S630) may slowly cool the substrate GL. The cooling of the substrate GL (S630) may prevent the substrate GL that is ion-substituted from being deformed and may remove residual stress.

The cooling of the cassette CST and the substrate GL (S630) may prevent damaging impacts on the substrate GL that may occur when a portion of the surface of the ion-substituted substrate GL, which may be unstable and in high temperature, is combined with the potassium nitrate and solidifies. Additionally or alternatively, in a case where the cassette CST and the substrate GL are quickly cooled down, impacts occurring inside the substrate GL due to different cooling rates depending on portions of the substrate GL may be prevented. Therefore, internal cracks may be prevented from occurring in the substrate GL.

The cleaning of the cassette CST and the substrate GL (S640) may bubble-clean the substrate GL using air bubbles. The substrate GL may be cleaned and substantially simultaneously cooled through the cleaning of the cassette CST and the substrate GL (S640). Accordingly, the residual stress generated in the substrate GL in the chemical reinforcing (S620) may be removed, and as a result, the substrate GL may be further stabilized.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A method of processing a glass substrate to manufacture a reinforced glass substrate, comprising: providing a cassette comprising a first frame, a second frame spaced apart from the first frame in a first direction, a first support bar coupled with the first frame and extending in a second direction crossing the first direction, first branch portions protruding from the first support bar toward the second frame, a second support bar disposed under the first support bar, and second branch portions protruding from the second support bar toward the second frame; fixing the glass substrate to a robot arm; adjusting a distance between the first branch portions and the second branch portions in a direction substantially parallel to the second direction to a first distance by moving at least one of the first support bar or the second support bar along the second direction; loading the glass substrate between the first frame and the second frame and between at least one of the first branch portions and at least one of the second branch portions; adjusting the distance between the first branch portions and the second branch portions to a second distance smaller than the first distance by moving at least one of the first support bar or the second support bar along the second direction; and performing a chemical reinforcement process on the glass substrate that reinforces the glass substrate.

2. The method of claim 1, wherein a maximum distance of the first distance is greater than a width in the second direction of the robot arm.

3. The method of claim 1, wherein a maximum distance of the second distance is greater than a thickness of the substrate in the direction substantially parallel to the second direction.

4. The method of claim 1, wherein a maximum distance of the second distance is smaller than a width in the second direction of the robot arm.

5. The method of claim 1, wherein the reinforcing of the substrate comprises:
   preheating the cassette and the substrate;
   chemically reinforcing the cassette and the substrate; and
   cooling the cassette and the substrate.

6. The method of claim 1, wherein the first branch portions protrude from the first support bar in a first crossing direction crossing the first direction and the second direction, and the second branch portions protrude from the second support bar in a second crossing direction crossing the first crossing direction.

7. The method of claim 1, wherein the first branch portions protrude from the first support bar to a direction substantially parallel to the first direction, and the second branch portions is substantially parallel to the first branch portion.

* * * * *